(12) United States Patent
Ozawa

(10) Patent No.: US 8,228,116 B2
(45) Date of Patent: Jul. 24, 2012

(54) SEMICONDUCTOR INTEGRATED CIRCUIT AND POWER SUPPLY VOLTAGE CONTROL METHOD

(75) Inventor: Motohiro Ozawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/137,979

(22) Filed: Sep. 22, 2011

(65) Prior Publication Data

US 2012/0013381 A1    Jan. 19, 2012

Related U.S. Application Data

(63) Continuation of application No. PCT/JP2009/056672, filed on Mar. 31, 2009.

(51) Int. Cl.
G05F 3/02 (2006.01)

(52) U.S. Cl. .......................... 327/538; 327/540; 327/541

(58) Field of Classification Search .................. 327/538, 327/540, 541

See application file for complete search history.

(56) References Cited

U.S. PATENT DOCUMENTS

| | | | | |
|---|---|---|---|---|
| 5,563,546 | A  * | 10/1996 | Tsukada | 327/408 |
| 7,475,165 | B2 * | 1/2009  | Mitani et al. | 710/14 |
| 7,608,942 | B2 * | 10/2009 | Chun et al. | 307/39 |
| 7,830,039 | B2 * | 11/2010 | Nguyen et al. | 307/65 |
| 2001/0033195 | A1 | 10/2001 | Kanda et al. | |
| 2002/0196074 | A1 | 12/2002 | Kanda et al. | |
| 2005/0052307 | A1 | 3/2005  | Nakano et al. | |
| 2008/0068045 | A1 | 3/2008  | Tokunaga | |

FOREIGN PATENT DOCUMENTS

| | | |
|---|---|---|
| JP | 2001-229697 | 8/2001 |
| JP | 2004-228104 | 8/2004 |
| JP | 2005-086108 | 3/2005 |
| JP | 2006-133165 | 5/2006 |
| JP | 2008-072045 | 3/2008 |

OTHER PUBLICATIONS

International Search Report mailed on May 19, 2009 in corresponding PCT Application No. PCT/JP2009/056672.

* cited by examiner

*Primary Examiner* — Kenneth B. Wells
(74) *Attorney, Agent, or Firm* — Staas & Halsey LLP

(57) ABSTRACT

A semiconductor integrated circuit includes a selector to selectively output and supply to a monitoring target voltage terminal one of a power supply voltage from an outside of the semiconductor integrated circuit and a predetermined reference voltage depending on an adjusting mode signal, a voltage monitoring circuit to monitor a voltage fluctuation at the monitoring target voltage terminal and converting the voltage fluctuation that is monitored into a control signal, and an input and output circuit to output the control signal to the outside.

12 Claims, 12 Drawing Sheets

US 8,228,116 B2

SEMICONDUCTOR INTEGRATED CIRCUIT AND POWER SUPPLY VOLTAGE CONTROL METHOD

CROSS-REFERENCE TO RELATED APPLICATIONS

This application is a continuation application filed under 35 U.S.C. 111(a) claiming the benefit under 35 U.S.C. 120 and 365(c) of a PCT International Application No. PCT/JP2009/056672 filed on Mar. 31, 2009, in the Japanese Patent Office, the disclosure of which is hereby incorporated by reference.

FIELD

The embodiment discussed herein relates to a semiconductor integrated circuit and a power supply voltage control method.

BACKGROUND

FIG. 1 is a diagram for explaining an example of a conventional power supply voltage control method. In FIG. 1, a LSI (Large Scale Integrated circuit) 1 includes a power line 2 that has a resistance, an inductance and a capacitance, and transistors 3. A DC-DC converter 5 that converts a DC (Direct Current) input voltage into a predetermined DC output voltage supplies a converted power supply voltage VDD to the LSI 1 via a power line 6 that includes a resistance, an inductance and a capacitance. In FIG. 1, GND denotes the ground. In this example, a voltage at a power supply input terminal of the LSI 1, that is, an analog voltage signal, is fed back to the DC-DC converter 5 in order to control the power supply voltage VDD.

In the example illustrated in FIG. 1, the voltage at the power supply input terminal of the LSI 1 is monitored and fed back to the DC-DC converter 5. Because the voltage drop on the power line 2 does not necessarily stabilize, the power supply voltage that is actually applied to the transistors 3 within the LSI 1 may be unknown. Consequently, it is difficult to control the power supply voltage that is applied to the transistors 3 within the LSI 1 to a constant voltage.

It is conceivable to provide a dedicated line exclusively for monitoring the power supply voltage that is actually applied to the transistors 3 within the LSI 1. But in this case, a fluctuation in the power supply voltage at a high frequency may not be monitored unless the resistance of the dedicated line is reduced to a sufficiently small resistance. In addition, when the dedicated line is provided, it is necessary to separately provide on a package of the LSI 1 a terminal (that is, a signal pin) exclusively for the voltage monitoring. Furthermore, when a voltage monitoring point is provided at a central part within the LSI 1, it is necessary to route the signal lines within the package so as not to interfere with existing lines. Consequently, the degree of freedom of layout within the package of the LSI 1 deteriorates, and the area occupied by the lines increases to thereby limit the area in which circuit elements such as the transistors 3 may be provided within the LSI 1.

The applicant is aware of Japanese Laid-Open Patent Publications No. 2004-228104 and No. 2008-72045.

According to the conventional power supply voltage control method, there is a problem in that it is difficult to maintain the power supply voltage constant within the LSI using a relatively simple structure, without increasing the number of terminals of the LSI package.

SUMMARY

Accordingly, it is an object in one aspect of the present invention to provide a semiconductor integrated circuit and a power supply voltage control method which may maintain the power supply voltage constant within the semiconductor integrated circuit using a relatively simple structure, without increasing the number of terminals of the semiconductor integrated circuit.

According to one aspect of the present invention, a semiconductor integrated circuit includes a first selector that selectively outputs one of a power supply voltage supplied from an outside of the semiconductor integrated circuit and a reference voltage to a monitoring target voltage terminal depending on an adjusting mode signal; a voltage monitoring circuit that monitors a voltage fluctuation at the monitoring target voltage terminal and converts the monitored voltage fluctuation into a control signal; and an output circuit that outputs the control signal to the outside of the semiconductor integrated circuit.

According to another aspect of the present invention, a power supply voltage control method for controlling a power supply voltage supplied from a power supply control circuit to a semiconductor integrated circuit includes switching a first selector within the semiconductor integrated circuit depending on an adjusting mode signal in order to selectively output a reference voltage to a monitoring target voltage terminal during a circuit adjusting period and the power supply voltage to the monitoring target voltage terminal during a voltage monitoring period; converting a voltage fluctuation monitored into a control signal at the monitoring target voltage terminal by a voltage monitoring circuit within the semiconductor integrated circuit; and controlling the power supply voltage output from the voltage control circuit by outputting the control signal from an output circuit within the semiconductor integrated circuit to the voltage control circuit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be described with reference to the accompanying drawings.

According to the semiconductor integrated circuit and the power supply voltage control method that are disclosed herein, a power supply control circuit controls a power supply voltage supplied to the semiconductor integrated circuit. A selector within the semiconductor integrated circuit is switched depending on an adjusting mode signal in order to selectively output a predetermined reference voltage during a circuit adjusting period and to selectively output the power supply voltage during a voltage monitoring period, to be supplied to a monitoring target voltage terminal. A voltage fluctuation at the monitoring target voltage terminal is monitored by a voltage monitoring circuit within the semiconductor integrated circuit, and the monitored voltage fluctuation is output after being converted into a digital signal. The digital signal is output from an input and output circuit to a voltage control circuit within the semiconductor integrated circuit to the voltage control circuit, in order to control a power supply voltage output from the voltage control circuit.

The input and output circuit may selectively output scan data prescribed by the IEEE1149.1 JTAG (Joint Test Action Group) standard, for example, when performing a test, and may output the digital signal during a normal operation. Accordingly, the power supply voltage within the semiconductor integrated circuit may be maintained constant using a relatively simple structure, without increasing the number of terminals of the semiconductor integrated circuit.

Next, a description will be given of the semiconductor integrated circuit and the power supply voltage control method in each embodiment of the present invention, by referring to FIG. 2 and the subsequent figures.

Figure 1:
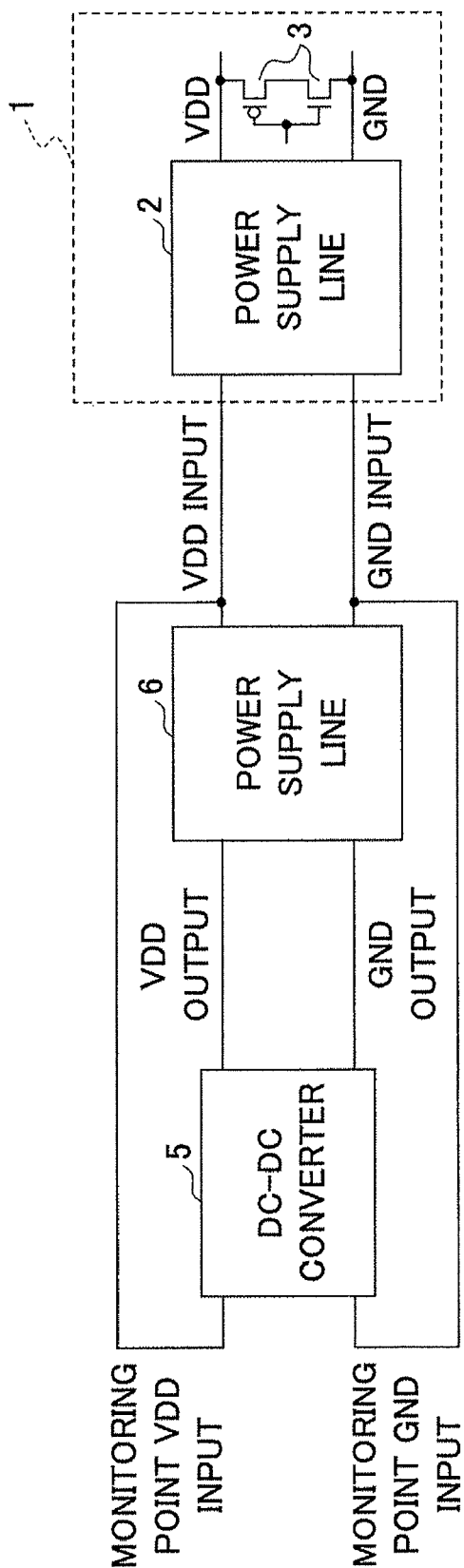
FIG. 1 is a diagram for explaining an example of a conventional power supply voltage control method.
Figure 2:
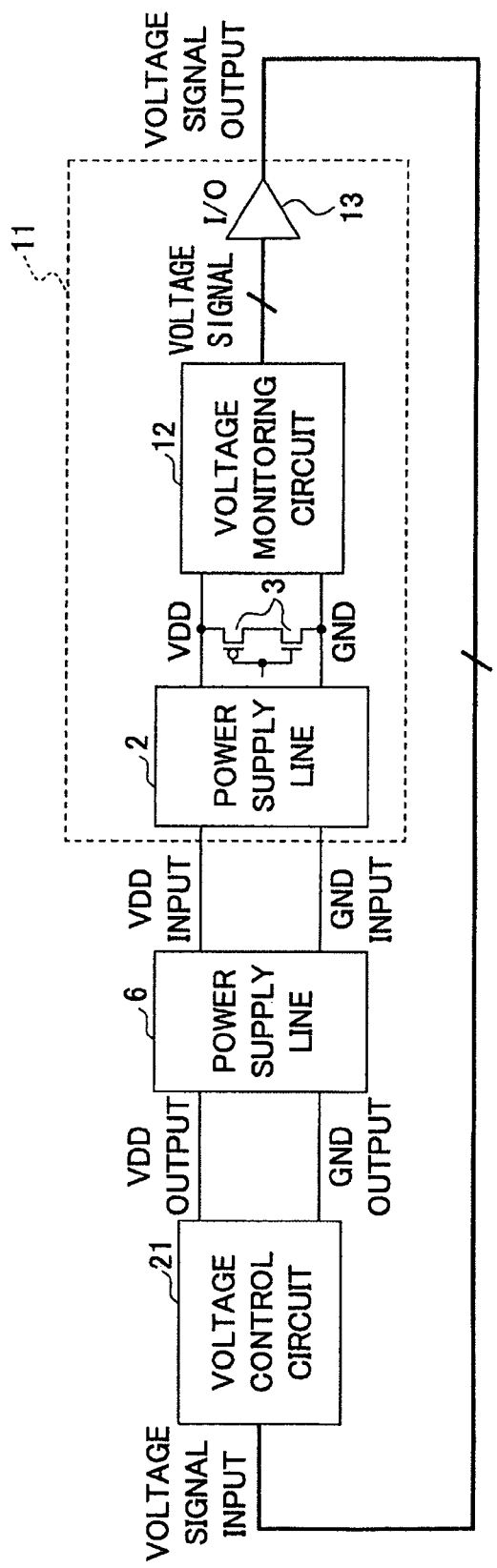
FIG. 2 is a diagram for explaining a power supply voltage control method in an embodiment of the present invention.

FIG. 2 is a diagram for explaining a power supply voltage control method in an embodiment of the present invention. In FIG. 2, those parts that are substantially the same as those corresponding parts in FIG. 1 are designated by the same reference numerals, and a description thereof will be omitted.

In FIG. 2, a LSI (Large Scale Integrated circuit) 11 includes a power line 2 that has a resistance, an inductance and a capacitance, transistors 3, a voltage monitoring circuit 12, and an input and output (I/O) circuit 13. A voltage control circuit 21 supplies a power supply voltage VDD to the LSI 11 via a power line 6 that has a resistance, an inductance and a capacitance. For example, the voltage control circuit 21 may be formed by a DC-DC converter that converts an input DC voltage into a predetermined output DC voltage. In FIG. 2, GND denotes the ground. In this example, the power supply voltage applied to the transistors 3 within the LSI 11 is monitored by the voltage monitoring circuit 12, and the power supply voltage VDD is controlled by feeding back a voltage signal corresponding to the monitored power supply voltage to the voltage control circuit 21 via the I/O circuit 13.

In the example illustrated in FIG. 2, the voltage monitoring circuit 12 monitors a voltage fluctuation of the power supply voltage applied to the transistors 3 within the LSI 11, and converts the monitored voltage fluctuation into a digital signal that is output. This digital signal is output from the LSI 11 via the I/O circuit 13, in a manner similar to a data signal, and is fed back to the voltage control circuit 21. For this reason, the power supply voltage applied to the transistors 3 within the LSI 11 may be maintained constant, based on a monitored result of the power supply voltage that is actually applied to the transistors 3 within the LSI 11.

A monitoring target voltage within the LSI 11, that is, the power supply voltage applied to the transistors 3, a predetermined reference voltage, and a control signal are input to the voltage monitoring circuit 12. In addition, the voltage monitoring circuit 12 is connected to the ground GND, and outputs a voltage signal corresponding to the monitoring target voltage or a voltage state signal representing a state of the monitoring target voltage. The voltage monitoring circuit 12 outputs the voltage signal or the voltage state signal, indicating how high or how low the monitoring target voltage is with respect to the predetermined reference voltage that is input to the voltage monitoring circuit 12. The number of bits of the voltage signal or the voltage state signal output from the voltage monitoring circuit 12 determines the resolution of the power supply voltage control. The control signal input to the voltage monitoring circuit 12 is used to adjust inconsistencies in the characteristics, sensitivities, and the like of the transistors within the voltage monitoring circuit 12 that may include PMOS (P-channel Metal Oxide Semiconductor) transistors and NMOS (N-channel Metal Oxide Semiconductor) transistors.

According to the power supply voltage control method of FIG. 2, the fluctuation in the power supply voltage actually applied to the transistors 3 within the LSI 11 may be monitored, even in the case of a high-frequency fluctuation. In addition, because the voltage signal or the voltage state signal output from the voltage monitoring circuit 12 is a digital signal, the voltage signal or the voltage state signal may be output from the LSI 11 using the I/O circuit 13 that is originally provided within the LSI 11. Furthermore, even when a plurality of voltage monitoring points exist within the LSI 11, the voltage monitoring point may be switched by the control signal that is input to the voltage monitoring circuit 12. Even if the voltage monitoring point is located in a central part within the LSI 11, the wiring layout within the package of the LSI 11 may be designed with ease by outputting the voltage signal or the voltage state signal via the I/O circuit 13 that is located in a peripheral part within the LSI 11. Moreover, by outputting the voltage signal or the voltage state signal outside the LSI 11 via the I/O circuit 13 that is originally provided within the LSI 11 for use when performing a test, the number of terminals (that is, the number of signal pins) provided on the package of the LSI 11 may be reduced.

Figure 3:
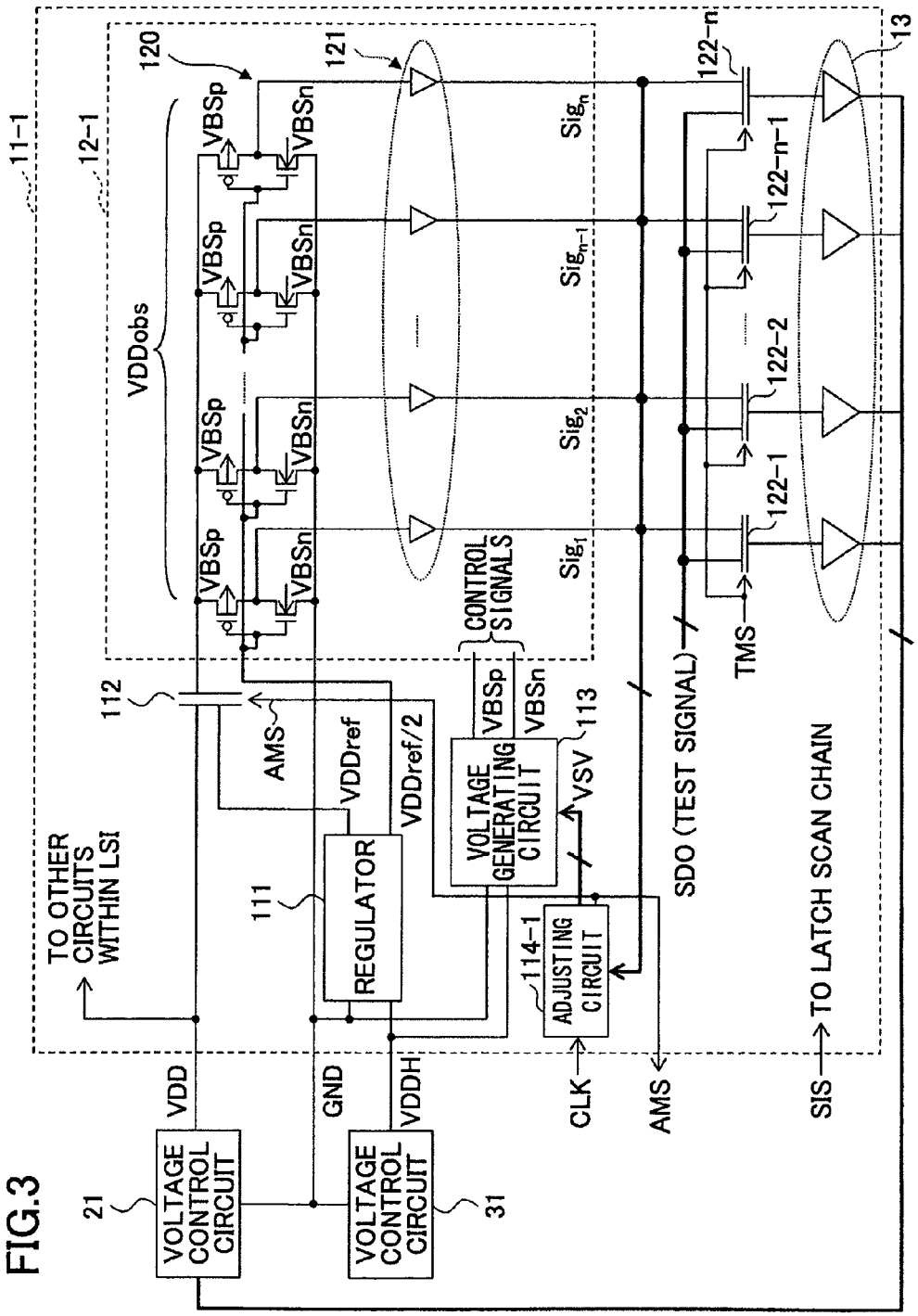
FIG. 3 is a diagram for explaining an example of a semiconductor integrated circuit.

FIG. 3 is a diagram for explaining an example of a semiconductor integrated circuit. In FIG. 3, those parts that are the same as those corresponding parts in FIG. 2 are designated by the same reference numerals, and a description thereof will be omitted. For the sake of convenience, the power supply lines 2 and 6 are not illustrated as blocks and the illustration of the transistors 3 is omitted in FIG. 3 and FIGS. 7, 11 and 12 which will be described later.

A LSI 11-1 includes a regulator 111, a selector 112, a voltage generating circuit 113, an adjusting circuit 114-1, a voltage monitoring circuit 12-1, selectors 122-1 through 122-n, and an I/O circuit 13 that are connected as illustrated in FIG. 3. The voltage monitoring circuit 12-1 includes a plurality of inverter circuits 120, including PMOS transistors and NMOS transistors, and a plurality of buffers 121 for shaping signal waveforms. For example, the selectors 112 and 122-1 through 122-n may be formed by transfer gates.

A power supply voltage VDD output from a voltage control circuit (DC-DC converter) 21, and a predetermined reference voltage VDDref output from the regulator 111, are input to the selector 112. Accordingly, the power supply voltage VDD from outside the LSI 11-1 or the reference voltage VDDref from the regulator 111 is supplied to a monitoring target voltage terminal VDDobs of the voltage monitoring circuit 12-1 via the selector 112. The regulator 111 generates the reference voltage VDDref and a voltage VDDref/2 based on a voltage VDDH that is higher than the power supply voltage VDD and is output from the voltage control circuit (DC-DC converter) 31, and supplies the voltage VDDref/2 to the inverter circuits 120 of the voltage monitoring circuit 12-1.

The adjusting circuit 114-1 generates an adjusting mode signal AMS and a voltage setting value VSV based on a clock signal CLK and voltage signals $Sig_1$ through $Sig_n$ that are output from the buffers 121 of the voltage monitoring circuit 12-1, and supplies the adjusting mode signal AMS outside the LSI 11-1 and to the selector 112 as a selection signal. The adjusting circuit 114-1 supplies the voltage setting value VSV to the voltage generating circuit 113.

The voltage generating circuit 113 generates control signals VBSp and VBSn based on the voltage VDDH output from the voltage control circuit 31 and the voltage setting value VSV output from the adjusting circuit 114-1, and supplies the control signals VBSp and VBSn to the PMOS transistors and the NMOS transistors forming the inverter circuits 120 of the voltage monitoring circuit 12-1 as control signals. The control signal VBSp is applied as a back bias signal to the PMOS transistor of each inverter circuit 120, and the control signal VBSn is applied as a back bias signal to the NMOS transistor of each inverter circuit 120. A scan-in signal SIS is input to the LSI 11-1 and supplied to a known latch scan chain (not illustrated) within the LSI 11-1. A scan data output (or test signal) SDO of the latch scan chain is supplied to one input of each of the selectors 122-1 through 122-n, and the voltage signals $Sig_1$ through $Sig_n$ output from the voltage monitoring circuit 12-1 are supplied to respective other inputs of each of the selectors 122-1 through 122-n. A test mode signal TMS is supplied, as a selection signal, to each of the selectors 122-1 through 122-n. Outputs of the selectors 122-1 through 122-n are output from the LSI 11-1 via the I/O circuit 13 and fed back to the voltage control circuit 21.

The plurality of inverter circuits 120 within the voltage monitoring circuit 12-1 have mutually different threshold voltages by varying β values of transistors in order to vary outputs of the transistors, for example. In this example, the inverter circuits 120 located more towards the left side in FIG. 3 may more easily output a logic value "1" (or a high level). The voltage of the monitoring target voltage terminal VDDobs is applied to the transistors of each inverter circuit 120 as a power supply voltage. In addition, the voltage VDDref/2 generated by the regulator 111 is applied to each inverter circuit 120. Because the inverter circuit 120 located more towards the left side in FIG. 3 may more easily output the logic value "1", the output pattern of the plurality of inverter circuits 120 changes depending on the level of the power supply voltage at the monitoring target voltage terminal VDDobs. An output waveform of each inverter circuit 120 is shaped by the corresponding buffer 121. Hence, the shaped voltage signals $Sig_1$ through $Sig_n$ from the buffers 121 are output from the voltage monitoring circuit 12-1.

Because the number of input and output terminals of the LSI 11-1, that is, the number of signal pins of the package of the LSI 11-1, is not increased in order to output the voltage signals $Sig_1$ through $Sig_n$, the I/O circuit 13 that is originally used for the test signal only when testing the LSI 11-1 and is not used during normal operation, may be used in common for the voltage signals $Sig_1$ through $Sig_n$. In this example, the test signal is formed by the scan data output SDO (Scan Data Output) of the parallel scan. The selectors 122-1 through 122-n are switched depending on the test mode signal TMS to output the scan data output SDO or the voltage signals $Sig_1$ through $Sig_n$. At the time of the testing, the test mode signal TMS has a logic value "0", and the parallel scan data output SDO is supplied to the I/O circuit 13. On the other hand, at the time of the normal operation, the test mode signal TMS has a logic value "1", and the voltage signals $Sig_1$ through $Sig_n$ are supplied to the I/O circuit 13.

In FIG. 3, the voltage monitoring is performed after adjusting the circuit in order to absorb inconsistencies in the characteristics of individual LSIs 11-1. First, the predetermined reference voltage VDDref is supplied to the monitoring target voltage terminal VDDobs of the voltage monitoring circuit 12-1, and the voltages of the control signals VBSp and VBSn generated by the voltage generating circuit 113 are adjusted so that the output pattern of the voltage signals $Sig_1$ through $Sig_n$ becomes ideal (for example, the pattern includes the same number of logic value "0"s and logic value "1"s). The control signals VBSp and VBSn may be fixed to the voltages after the adjustment. Then, the voltage supplied to the monitoring target voltage terminal VDDobs is switched to the power supply voltage VDD before starting the normal operation of the LSI 11-1, and the actual voltage at the monitoring target voltage terminal VDDobs is monitored.

Figure 4:
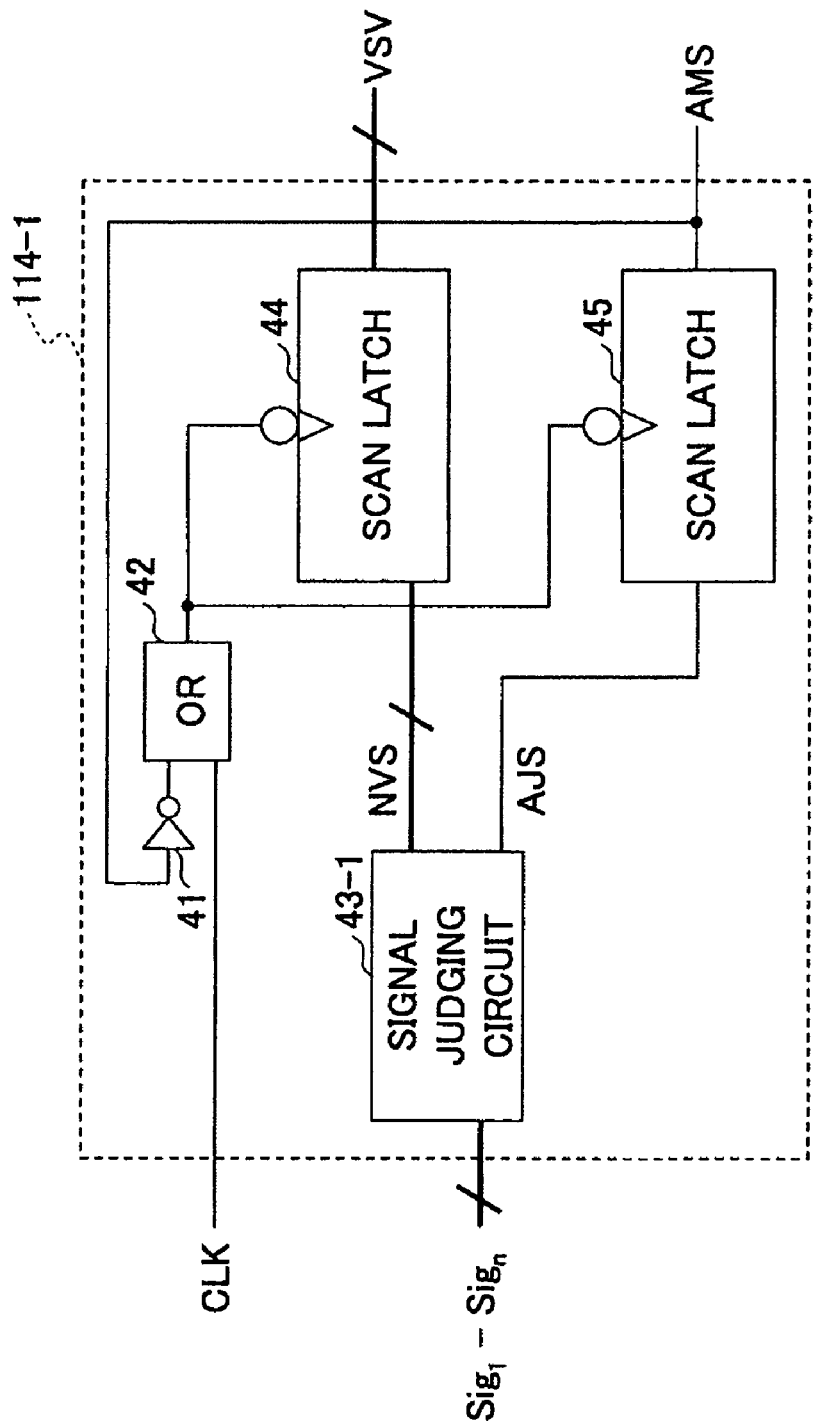
FIG. 4 is a diagram for explaining an example of an adjusting circuit illustrated in FIG. 3.

FIG. 4 is a diagram for explaining an example of the adjusting circuit 114-1 illustrated in FIG. 3. The adjusting circuit 114-1 includes an inverter circuit 41, an OR circuit 42, a signal judging circuit 43-1, a scan latch 44 for retaining a voltage setting value, and a scan latch 45 for retaining and adjusting mode, that are connected as illustrated in FIG. 4.

The value of the scan latch 45 is set to a logic value "1" indicating the adjusting mode, and the value of the scan latch 44 is set to an initial value, by the scan. In this state, the selector 112 selectively outputs the predetermined reference voltage VDDref from the regulator 111 depending on the adjusting mode signal AMS. The signal judging circuit 43-1 judges whether the voltage signals $Sig_1$ through $Sig_n$ have the setting values (for example, the same number of logic value "0"s and logic value "1"s), and outputs a next voltage setting value NVS and an adjustment judging signal AJS. The next voltage setting value NVS and the adjustment judging signal AJS are input to the scan latch 44 and the scan latch 45 every time the clock signal CLK is applied thereto. The next voltage setting value NVS changes the setting values in order to increase the voltages of the control signals VBSp and VBSn when the number of logic value "1"s is larger and to decrease the voltages of the control signals VBSp and VBSn when the number of logic value "0"s is larger as a result of comparing the setting value and the values of the voltage signals $Sig_1$ through $Sig_n$. In this example, the adjustment judging signal AJS output from the signal judging circuit 43-1 assumes the logic value "0" when the setting value and the values of the voltage signals $Sig_1$ through $Sig_n$ match, and otherwise assumes the logic value "1".

When the value of the scan latch 45 assumes the logic value "0", the clock signal CLK to the scan latches 44 and 45 within the adjusting circuit 114-1 are disabled. In addition, a completion of the adjustment may be judged from the adjusting mode signal AMS that is output from the LSI 11-1 to the outside.

Figure 5:
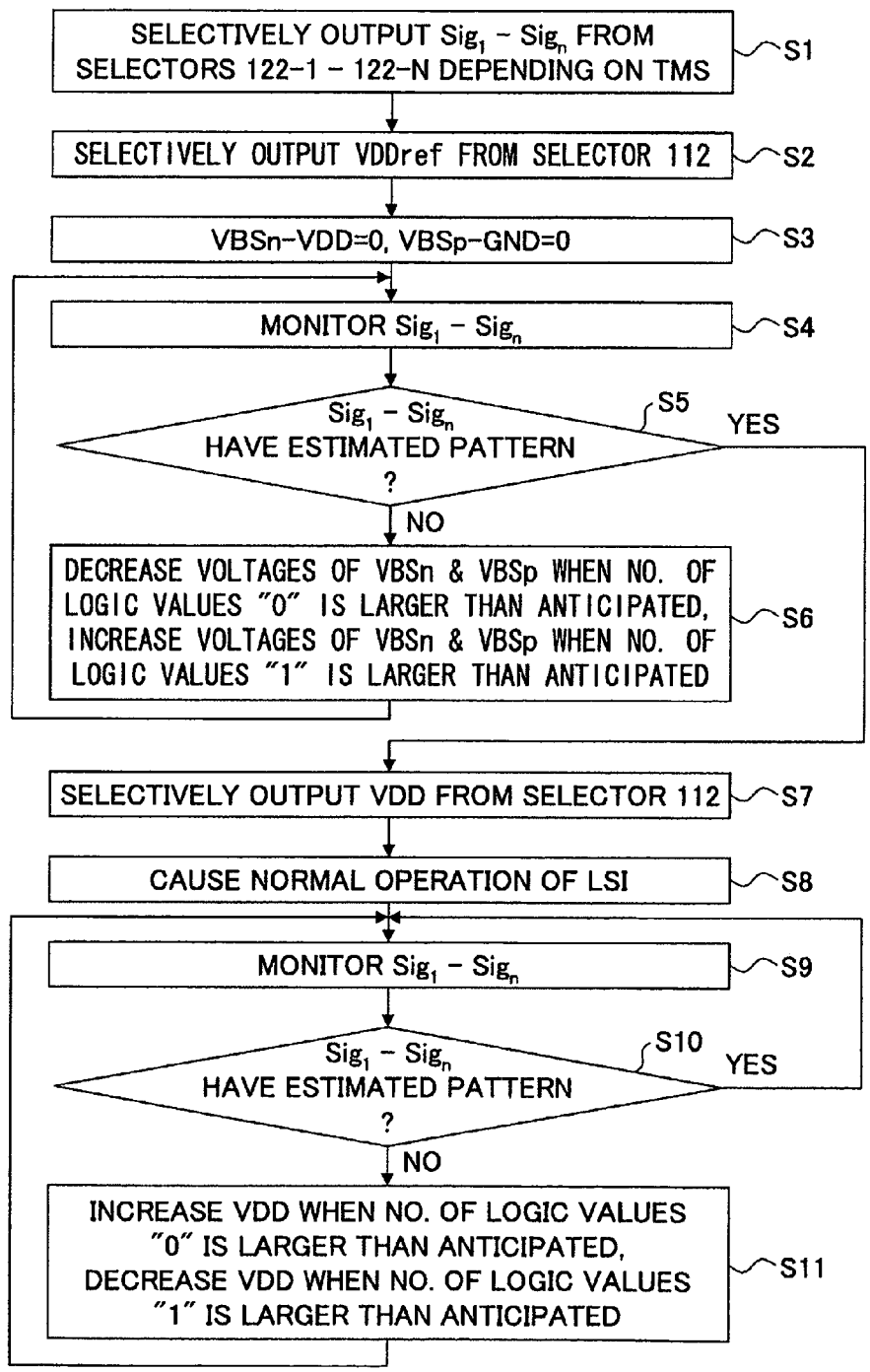
FIG. 5 is a flow chart for explaining an operation of the semiconductor integrated circuit illustrated in FIG. 3.

FIG. 5 is a flow chart for explaining an operation of the semiconductor integrated circuit illustrated in FIG. 3. In FIG. 5, a step S1 selectively outputs the voltage signals $Sig_1$ through $Sig_n$ from the selectors 122-1 through 122-n depending on the test mode signal TMS. A step S2 selectively outputs the predetermined reference voltage VDDref from the selector 112 depending on the adjusting mode signal AMS. A step S3 sets an initial state by setting the voltage of the control signal VBSn with respect to the power supply voltage VDD to 0, and setting the voltage of the control signal VBSp with respect to the ground GND to 0. A step S4 monitors the voltage signals $Sig_1$ through $Sig_n$ by the adjusting circuit 114-1. A step S5 judges whether the voltage signals $Sig_1$ through $Sig_n$ have an estimated pattern. The process advances to a step S6 if the judgement result in the step S5 is NO, and the process advances to a step S7 if the judgement result in the step S5 is YES. The step S6 controls the voltage generating circuit 113 by the adjusting circuit 114-1, and decreases the voltages of the control signals VBSn and VBSp when the pattern of the voltage signals $Sig_1$ through $Sig_n$ includes a larger number of logic value "0"s than the estimated pattern, and increases the voltages of the control signals VBSn and VBSp when the pattern of the voltage signals $Sig_1$ through $Sig_n$ includes a larger number of logic value "1"s than the estimated pattern. The process returns to the step S4 after the step S6.

On the other hand, the step S7 selectively outputs the power supply voltage VDD from the selector 112 depending on the adjusting mode signal AMS. A step S8 causes the LSI 11-1 to perform a normal operation. A step S9 monitors the voltage signals $Sig_1$ through $Sig_n$ by the adjusting circuit 114-1. A step S10 judges whether the voltage signals $Sig_1$ through $Sig_n$ have the estimated pattern. The process advances to a step S11 if the judgement result in the step S10 is NO, and the process returns to the step S9 if the judgement result in the step S10 is YES. The step S11 controls the voltage control circuit 21 by the output of the LSI 11-1, and increases the power supply voltage VDD when the pattern of the voltage signals $Sig_1$ through $Sig_n$ includes a larger number of logic value "0"s than the estimated pattern, and decreases the power supply voltage VDD when the pattern of the voltage signals $Sig_1$ through $Sig_n$ includes a larger number of logic value "1"s than the estimated pattern. The process returns to the step S9 after the step S11.

Figure 6:
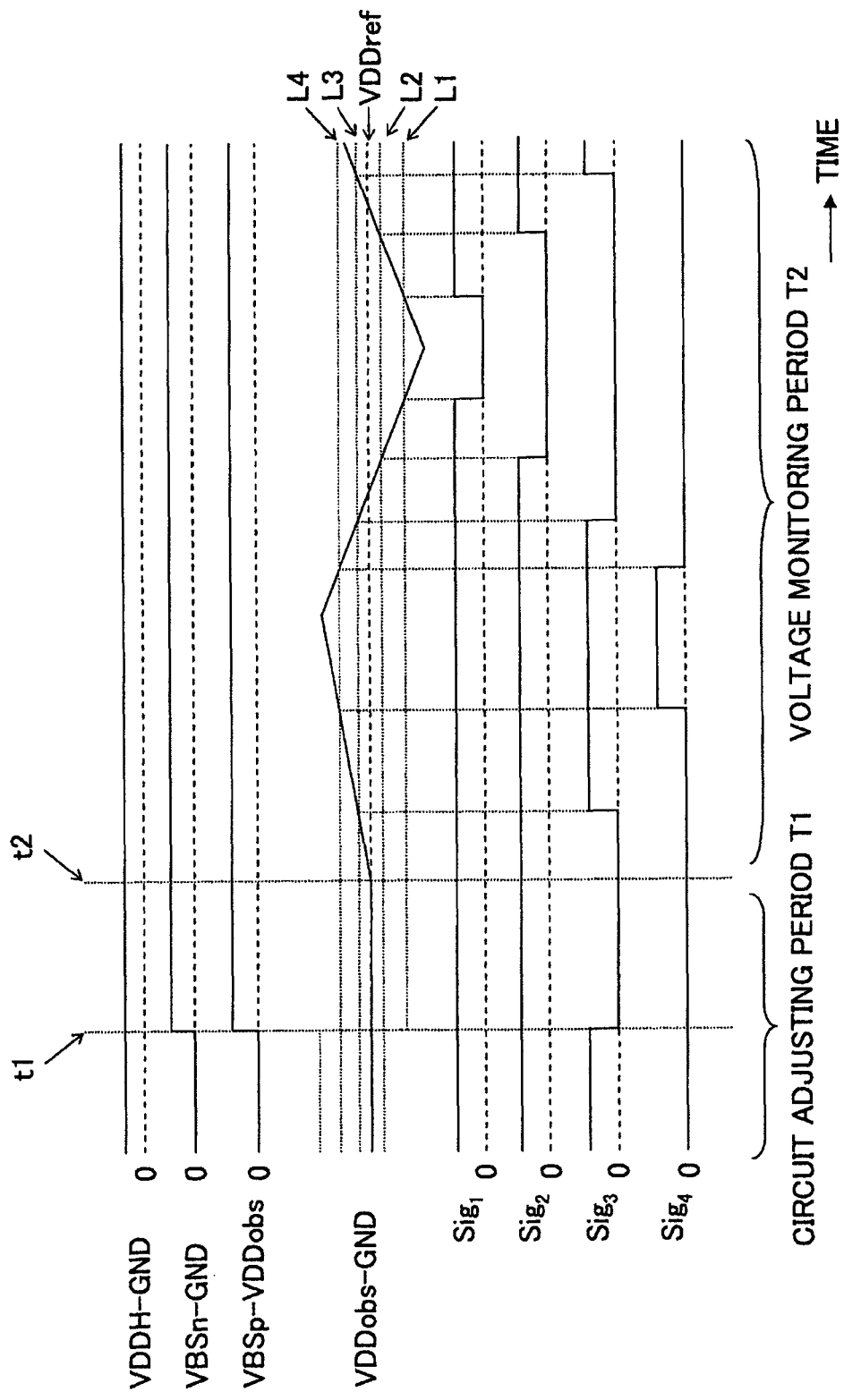
FIG. 6 is a timing chart for explaining the operation of the semiconductor integrated circuit illustrated in FIG. 3.

FIG. 6 is a timing chart for explaining the operation of the semiconductor integrated circuit illustrated in FIG. 3. In FIG. 6, the ordinate indicates the voltage in arbitrary units, and the abscissa indicates the time in arbitrary units. FIG. 6 illustrates the voltage VDDH with respect to the ground GND, the voltage of the control signal VBSn with respect to the ground GND, the voltage of the control signal VBSp with respect to the voltage of the monitoring target voltage terminal VDDobs, the voltage of the monitoring target voltage terminal VDDobs with respect to the ground GND, and the voltages of the voltage signals $Sig_1$ through $Sig_n$.

In FIG. 6, t1 denotes a timing at which the voltages of the control signals VBSn and VBSp are increased in order to make the logic value of the voltage signal $Sig_3$ "0", and t2 denotes a timing at which the voltage of the monitoring target voltage terminal VDDobs is switch from the predetermined reference voltage VDDref to the power supply voltage VDD. In addition, L1, L2, L3 and L4 respectively denote levels at which the voltage signals $Sig_1$, $Sig_2$, $Sig_3$ and $Sig_4$ become 0. The circuit adjustment described above is performed during a circuit adjusting period or interval T1, and the monitoring of the voltage signals $Sig_1$ through $Sig_n$ described above is performed during a voltage monitoring period or interval T2.

Figure 7:
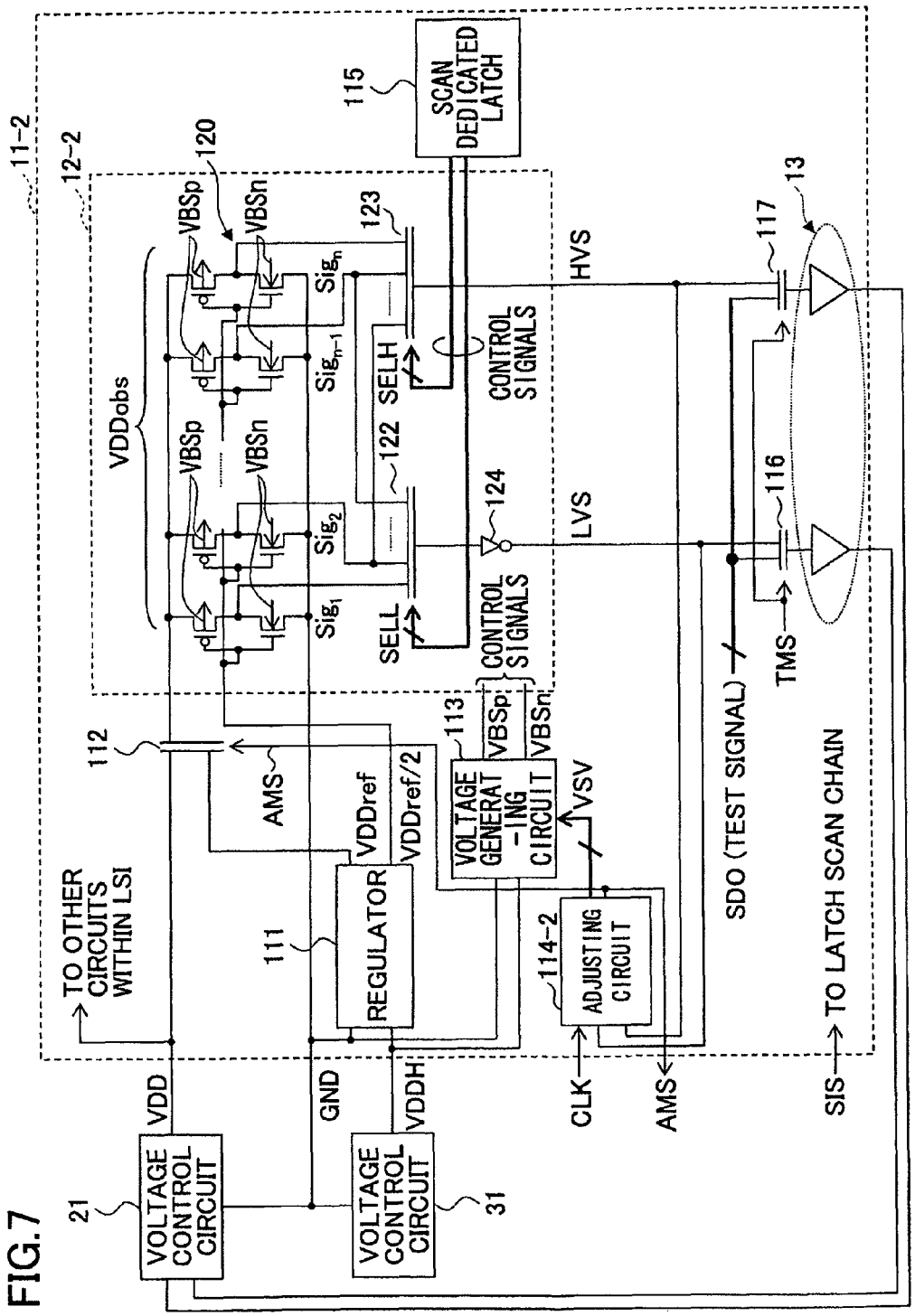
FIG. 7 is a diagram for explaining another example of the semiconductor integrated circuit.

FIG. 7 is a diagram for explaining another example of the semiconductor integrated circuit. In FIG. 7, those parts that are the same as those corresponding parts in FIG. 3 are designated by the same reference numerals, and a description thereof will be omitted.

In the example illustrated in FIG. 7, outputs of inverter circuits 120 that receive an input signal to a monitoring target voltage terminal VDDobs are not output directly to the outside from a voltage monitoring circuit 12-2, but are output to inputs of selectors 122 and 123. The selectors 122 and 123 respectively select signals to be output depending on control signals (or selection signals) SELL and SELH from a scan dedicated latch 115 for setting a voltage monitoring sensitivity. Outputs of the inverter circuits 120 selectively output from the selector 122 are received from the inverter circuits 120 having transistors having a lower threshold voltage than that of the inverter circuits 120 whose outputs are selectively output from the selector 123. The output of the selector 122 is output from the voltage monitoring circuit 12-2 as a low voltage signal LVS via an inverter 124. The output of the selector 123 is output from the voltage monitoring circuit 12-2 as a high voltage signal HVS. The low voltage signal LVS assumes a logic value "1" when a low voltage is monitored in the voltage monitoring circuit 12-2, and the high voltage signal HVS assumes a logic value "1" when a high voltage is monitored in the voltage monitoring circuit 12-2.

A scan-in signal SIS is input to the LSI 11-2 and supplied to a known latch scan chain (not illustrated) within the LSI 11-2. A scan data output (or test signal) SDO from the latch scan chain is supplied to one input of each of selectors 116 and 117. The low voltage signal LVS output from the voltage monitoring circuit 12-2 is supplied to the other input of the selector 116, and the high voltage signal HVS output from the voltage monitoring circuit 12-2 is supplied to the other input of the selector 117. In addition, a test mode signal TMS is supplied to each of the selectors 116 and 117 as a selection signal. Outputs of the selectors 116 and 117 are output from the LSI 11-2 via an I/O circuit 13, and fed back to a voltage control circuit 21.

In FIG. 7, the voltage monitoring is performed after adjusting the circuit in order to absorb inconsistencies in the characteristics of individual LSIs 11-2. First, the scan dedicated latch 115 supplies the control signals SELL and SELH in order to increase the voltage monitoring sensitivity and to select from the voltage signals $Sig_1$ through $Sig_n$ the voltage signals that are to be output as the low voltage signal LVS and the high voltage signal HVS. A predetermined reference voltage VDDref is supplied to a monitoring target voltage terminal VDDobs of the voltage monitoring circuit 12-2, in order to adjust control signals VBSn and VBSp generated by a voltage generating circuit 113 so that both the low voltage signal LVS and the high voltage signal HVS become 0. The control signals VBSn and VBSp are fixed to the voltages after the adjustment. Then, after arbitrarily setting the voltage monitoring sensitivity of the LSI 11-2 at the time of the normal operation by the control signals SELL and SELH, the voltage supplied to the monitoring target voltage terminal VDDobs is switched to the power supply voltage VDD before starting the normal operation of the LSI 11-2, and the actual voltage at the monitoring target voltage terminal VDDobs is monitored.

Because the number of input and output terminals of the LSI 11-2, that is, the number of signal pins of the package of the LSI 11-2, is not increased in order to output the low voltage signal LVS and the high voltage signal HVS, the I/O circuit 13 that is originally used for the test signal only when testing the LSI 11-2 and is not used during normal operation, may be used in common for the low voltage signal LVS and the high voltage signal HVS. In this example, the test signal is formed by the scan data output SDO of the parallel scan. The selectors 116 and 117 are switched depending on the test mode signal TMS to output the scan data output SDO or the low voltage signal LVS and the high voltage signal HVS. At the time of the testing, the test mode signal TMS has a logic value "0", and the parallel scan data output SDO is supplied to the I/O circuit 13. On the other hand, at the time of the normal operation, the test mode signal TMS has a logic value "1", and the low voltage signal LVS and the high voltage signal HVS are supplied to the I/O circuit 13.

Figure 8:
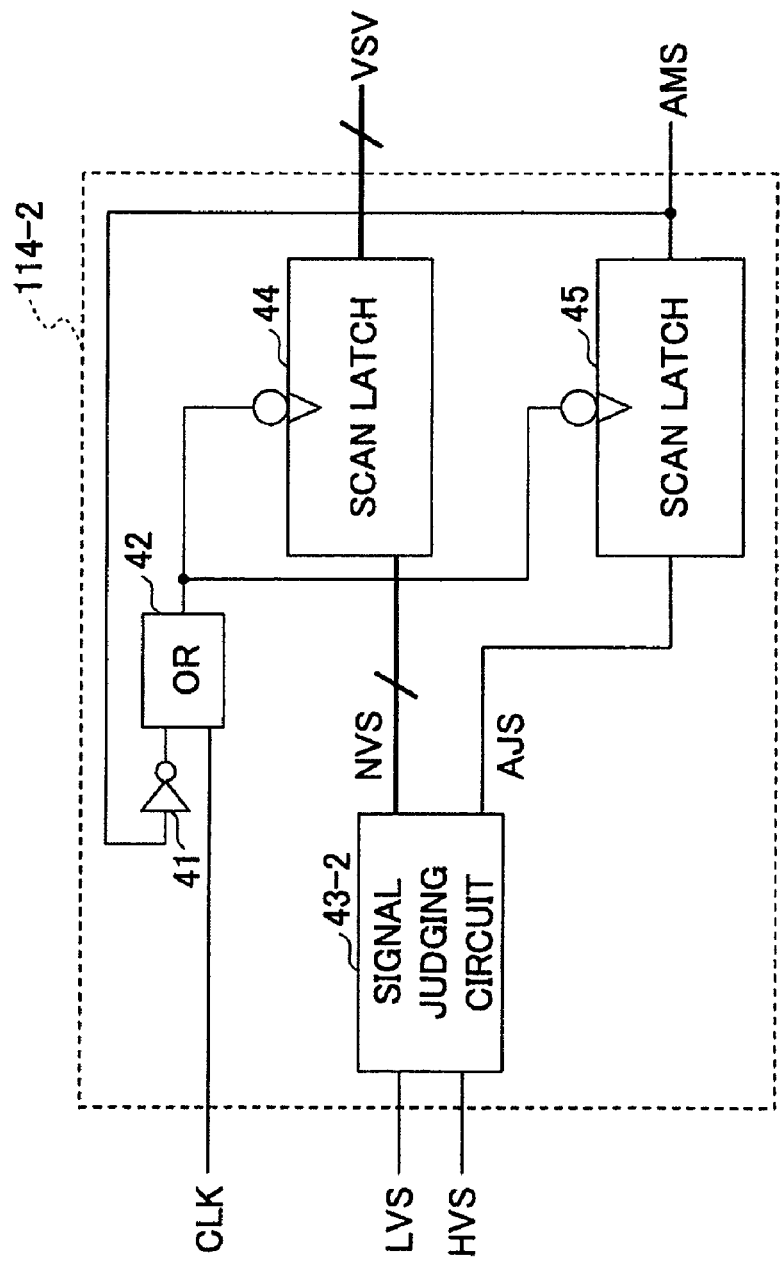
FIG. 8 is a diagram for explaining an example of an adjusting circuit illustrated in FIG. 7.

FIG. 8 is a diagram for explaining an example of the adjusting circuit 114-2 illustrated in FIG. 7. In FIG. 8, those parts that are the same as those corresponding parts in FIG. 4 are designated by the same reference numerals, and a description thereof will be omitted.

The value of a scan latch 45 is set to a logic value "1" indicating the adjusting mode, the value of a scan latch 44 is set to an initial value, and the scan dedicated latch 115 illustrated in FIG. 7 is set to selector setting values (SELL and SELH) to set the sensitivity to that of the voltage adjusting mode, by the scan. In this state, the selector 112 selectively outputs the predetermined reference voltage VDDref from the regulator 111 depending on the adjusting mode signal AMS. A signal judging circuit 43-2 judges whether both the low voltage signal LVS and the high voltage signal HVS have a logic value "0", and outputs a next voltage setting value NVS and an adjustment judging signal AJS. The next voltage setting value NVS and the adjustment judging signal AJS are input to the scan latch 44 and the scan latch 45 every time the clock signal CLK is applied thereto. The next voltage setting value NVS changes the setting values in order to increase the voltages of the control signals VBSp and VBSn when the high voltage signal HVS has the logic value "1" and to decrease the voltages of the control signals VBSp and VBSn when the low voltage signal LVS has the logic value "0". In this example, the adjustment judging signal AJS output from the signal judging circuit 43-2 assumes the logic value "0" when both the low voltage signal LVS and the high voltage signal HVS have the logic value "0", and otherwise assumes the logic value "1".

When the value of the scan latch 45 assumes the logic value "0", the clock signal CLK to the scan latches 44 and 45 within the adjusting circuit 114-2 are disabled. In addition, a completion of the adjustment may be judged from the adjusting mode signal AMS that is output from the LSI 11-2 to the outside.

Figure 9:
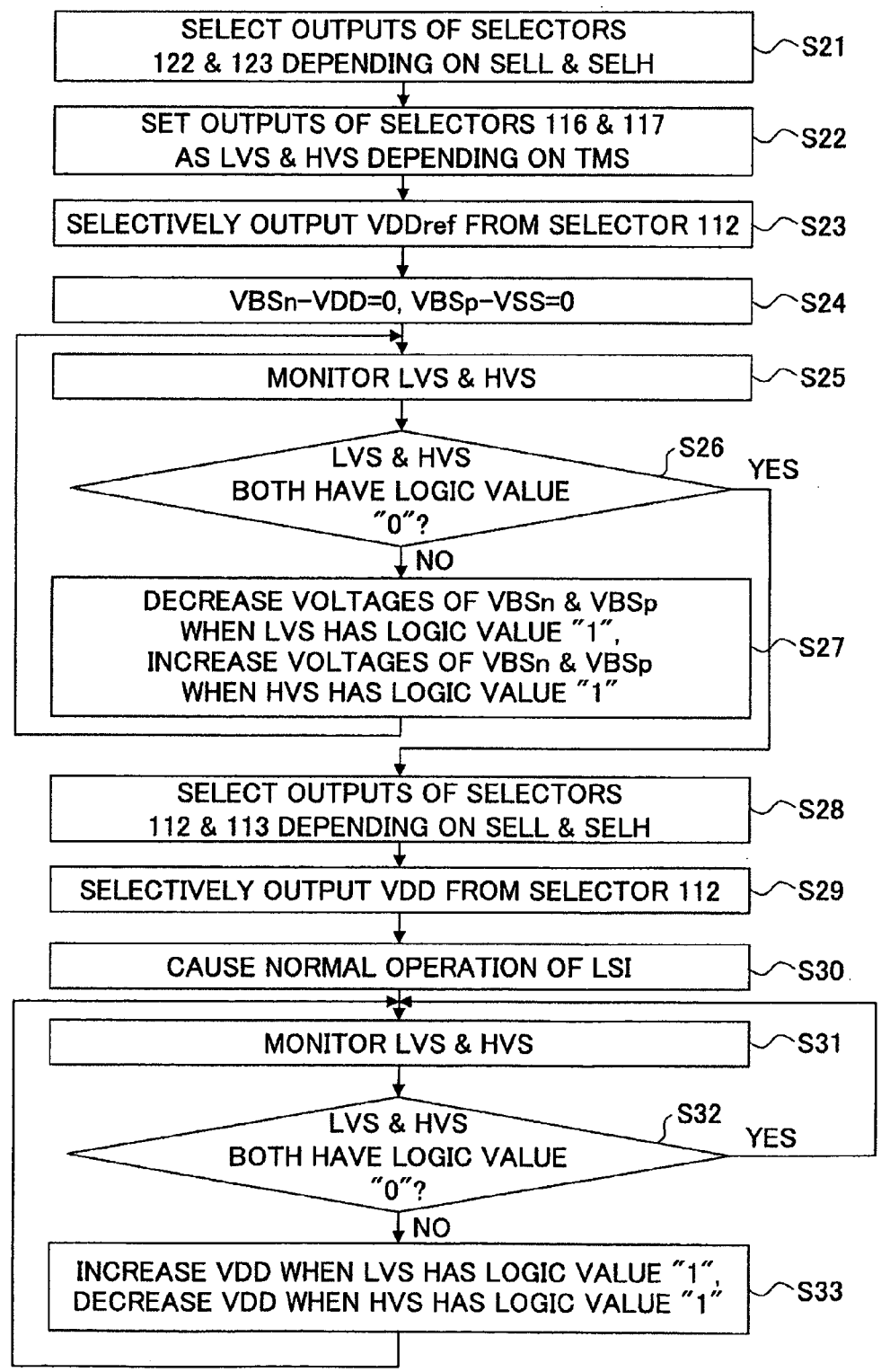
FIG. 9 is a flow chart for explaining an operation of the semiconductor integrated circuit illustrated in FIG. 7.

FIG. 9 is a flow chart for explaining an operation of the semiconductor integrated circuit illustrated in FIG. 7. In FIG. 9, a step S21 selects from the voltage signals $Sig_1$ through $Sig_n$ the voltage signals that are to be output from the selectors 122 and 123 as the low voltage signal LVS and the high voltage signal HVS at a high monitoring sensitivity depending on the control signals SELL and SELH, and outputs the selected voltage signals. A step S22 selectively outputs the low voltage signal LVS and the high voltage signal HVS from the selectors 116 and 117 depending on the test mode signal TMS. A step S23 selectively outputs the predetermined reference voltage VDDref from the selector 112 depending on the adjusting mode signal AMS. A step S24 sets an initial state by setting the voltage of the control signal VBSn with respect to the power supply voltage VDD to 0 and setting the voltage of the control signal VBSp with respect to the ground GND to 0. A step S25 monitors the low voltage signal LVS and the high voltage signal HVS by the adjusting circuit 114-2. A step S26 judges whether both the low voltage signal LVS and the high voltage signal HVS have the logic value "0". The process advances to a step S27 if the judgement result in the step S26 is NO, and the process advances to a step S28 if the judgement result in the step S26 is YES. The step S27 controls the voltage generating circuit 113 by the adjusting circuit 114-2, in order to decrease the voltages of the control signal VBSn and VBSp when the low voltage signal LVS has the logic value "1" and to increase the voltages of the control signals VBSn and VBSp when the high voltage signal HVS has the logic value "1". The process returns to the step S25 after the step S27.

On the other hand, the step S28 selects from the voltage signals $Sig_1$ through $Sig_n$ the voltage signals that are to be output from the selectors 122 and 123 as the low voltage signal LVS and the high voltage signal HVS at an arbitrary monitoring sensitivity depending on the control signals SELL and SELH, and outputs the selected voltage signals. A step S29 selectively outputs the power supply voltage VDD from the selector 112 depending on the adjusting mode signal AMS. A step S30 causes the LSI 11-2 to perform a normal operation. A step S31 monitors the low voltage signal LVS and the high voltage signal HVS by the adjusting circuit 114-2. A step S32 judges whether both the low voltage signal LVS and the high voltage signal HVS have the logic value "0". The process advances to a step S33 if the judgement result in the step S32 is NO, and the process returns to the step S31 if the judgement result in the step S32 is YES. The step S33 controls the voltage control circuit 21 by the output of the LSI 11-2, in order to increase the power supply voltage VDD when the low voltage signal LVS has the logic value "1" and to decrease the power supply voltage VDD when the high voltage signal HVS has the logic value "1". The process returns to the step S31 after the step S33.

Figure 10:
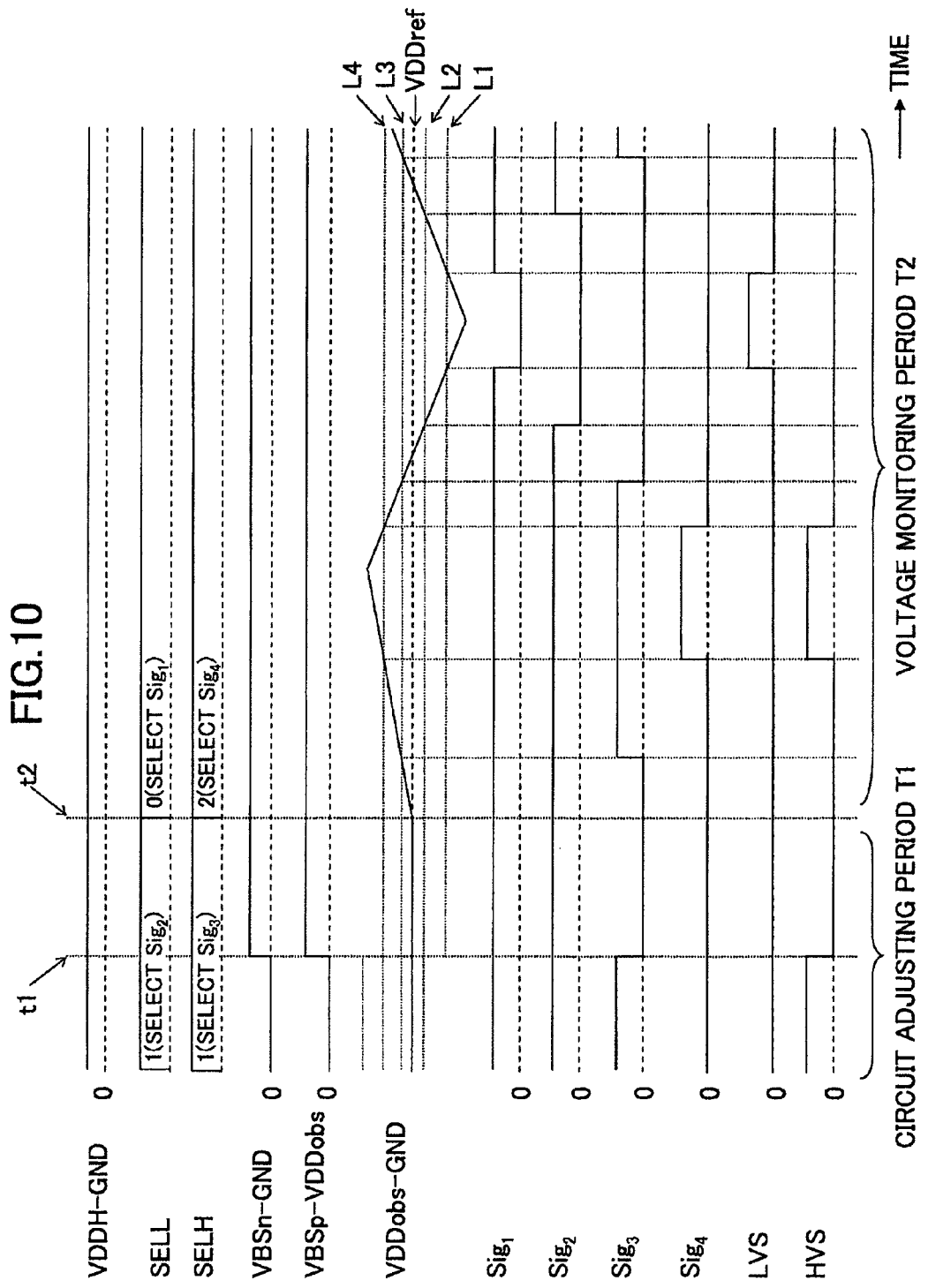
FIG. 10 is a timing chart for explaining the operation of the semiconductor integrated circuit illustrated in FIG. 7.

FIG. 10 is a timing chart for explaining the operation of the semiconductor integrated circuit illustrated in FIG. 7. In FIG. 10, the ordinate indicates the voltage in arbitrary units, and the abscissa indicates the time in arbitrary units. FIG. 10 illustrates the voltage VDDH with respect to the ground GND, the voltage of the control signal SELL, the voltage of the control signal SELH, the voltage of the control signal VBSn with respect to the ground GND, the voltage of the control signal VBSp with respect to the voltage at the monitoring target voltage terminal VDDobs, the voltage of the monitoring target voltage terminal VDDobs with respect to the ground GND, the voltages of the voltage signals $Sig_1$ through $Sig_4$, the voltage of the low voltage signal LVS, and the voltage of the high voltage signal HVS.

In FIG. 10, the voltage signal $Sig_1$ is selected when the logic value is "0", the voltage signal $Sig_2$ is selected when the logic value is "1", and the voltage signal $Sig_3$ is selected when the logic value is "2" for the control signal SELL. In addition, the voltage signal $Sig_2$ is selected when the logic value is "0", the voltage signal $Sig_3$ is selected when the logic value is "1", and the voltage signal $Sig_4$ is selected when the logic value is "2" for the control signal SELH.

Figure 11:
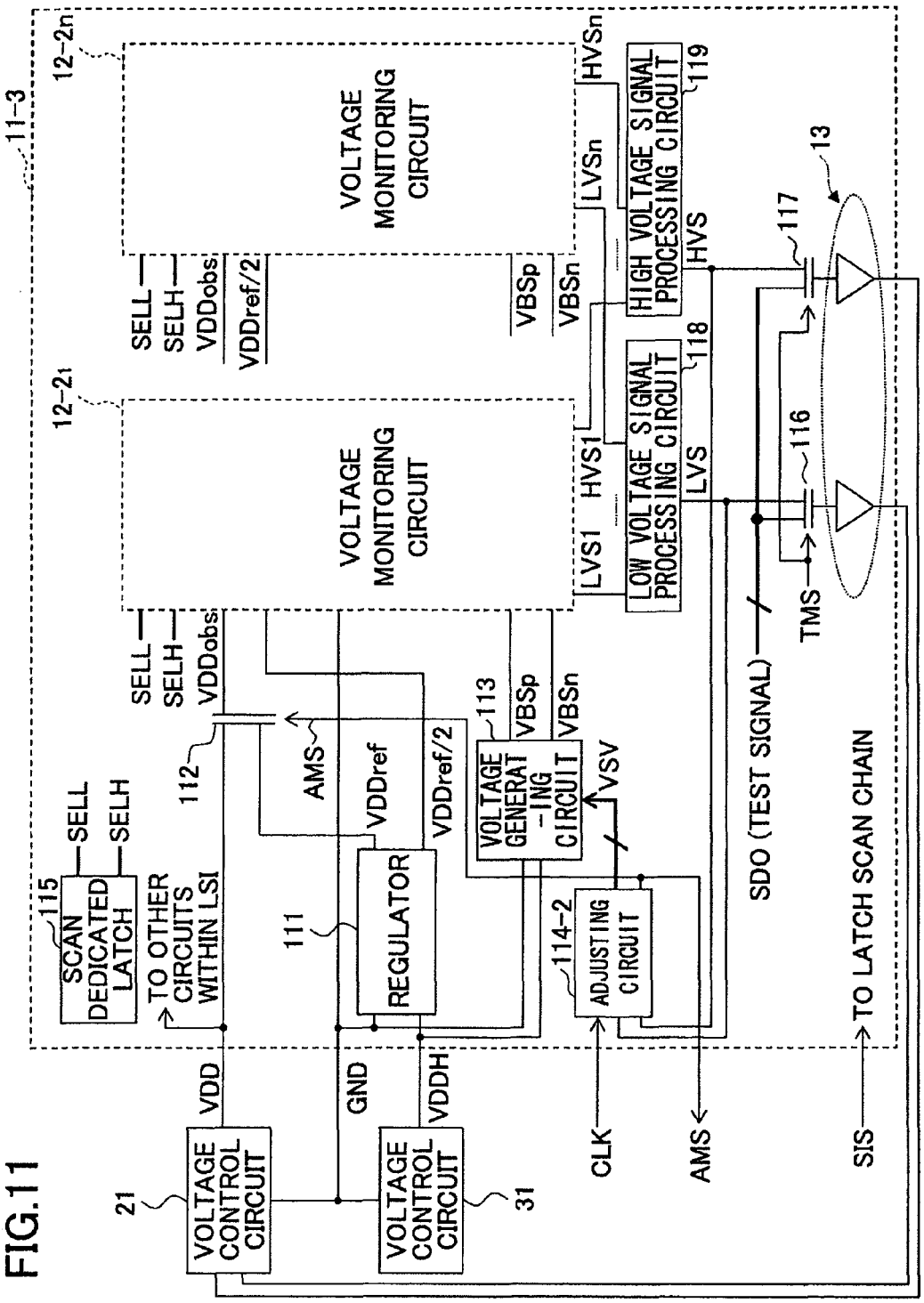
FIG. 11 is a diagram for explaining another example of the semiconductor integrated circuit.

FIG. 11 is a diagram for explaining another example of the semiconductor integrated circuit. In FIG. 11, those parts that are the same as those corresponding parts in FIG. 7 are designated by the same reference numerals, and a description thereof will be omitted. In FIG. 11, n voltage monitoring circuits $12\text{-}2_1$ through $12\text{-}2_n$, having the same structure as the voltage monitoring circuit 12-2 illustrated in FIG. 7, are provided in a LSI 11-3. A low voltage signal LVS1 and a high voltage signal HVS1 are output from the voltage monitoring circuit $12\text{-}2_1$, and a low voltage signal LVSn and a high voltage signal HVSn are output from the voltage monitoring circuit $12\text{-}2_n$. The low voltage signals LVS1 through LVSn from the voltage monitoring circuits $12\text{-}2_1$ through $12\text{-}2_n$ are supplied to a low voltage signal processing circuit 118. In addition, the high voltage signals HVS1 through HVSn from the voltage monitoring circuits $12\text{-}2_1$ through $12\text{-}2_n$ are supplied to a high voltage signal processing circuit 119. The low voltage signal processing circuit 118 outputs the low voltage signal LVS by performing on the low voltage signals LVS1 through LVSn a signal processing that may include a logical product operation, a logical sum operation, a majority operation, and the like. The high voltage signal processing circuit 119 outputs the high voltage signal HVS by performing on the high voltage signals HVS1 through HVSn a signal processing that may include a logical product operation, a logical sum operation, a majority operation, and the like. Accordingly, each of the low voltage signal processing circuit 118 and the high voltage signal processing circuit 119 may be formed by an AND circuit, an OR circuit, a majority circuit, and the like. The signal processings (that is, operations or computations) to be performed by the low voltage signal processing circuit 118 and the high voltage signal processing circuit 119 may be set appropriately depending on the usage or the like of the LSI 11-3.

Because the number of input and output terminals of the LSI 11-3, that is, the number of signal pins of the package of the LSI 11-3, is not increased in order to output the low voltage signal LVS and the high voltage signal HVS, the I/O circuit 13 that is originally used for the test signal only when testing the LSI 11-3 and is not used during normal operation, may be used in common for the low voltage signal LVS and the high voltage signal HVS. In this example, the test signal is formed by the scan data output SDO of the parallel scan. The selectors 116 and 117 are switched depending on the test mode signal TMS to output the scan data output SDO or the low voltage signal LVS and the high voltage signal HVS. At the time of the testing, the test mode signal TMS has a logic value "0", and the parallel scan data output SDO is supplied to the I/O circuit 13. On the other hand, at the time of the normal operation, the test mode signal TMS has a logic value "1", and the low voltage signal LVS and the high voltage signal HVS are supplied to the I/O circuit 13.

Figure 12:
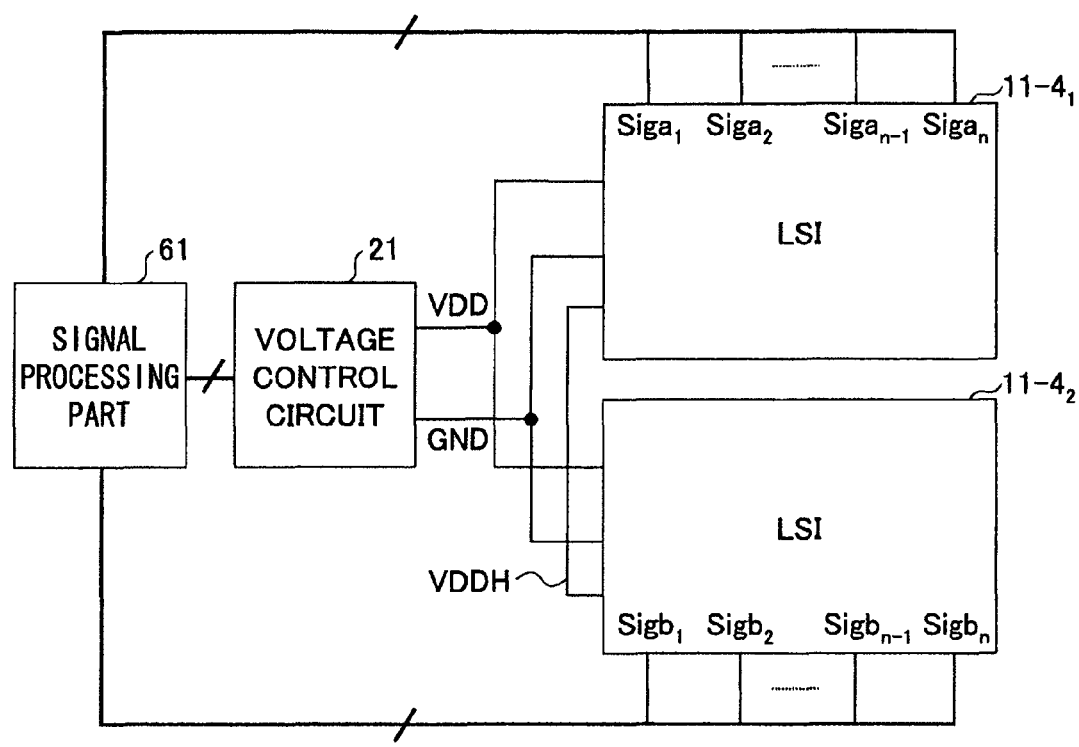
FIG. 12 is a diagram for explaining another example of the semiconductor integrated circuit.

FIG. 12 is a diagram for explaining another example of the semiconductor integrated circuit. In FIG. 12, those parts that are the same as those corresponding parts in FIG. 3 are designated by the same reference numerals, and a description thereof will be omitted.

In the example illustrated in FIG. 12, a power supply voltage VDD from a single voltage control circuit (DC-DC converter) 21 is supplied to a plurality of (two in this example) LSIs 11-4$_1$ and 11-4$_2$ having the same structure as the LSI 11-1 illustrated in FIG. 3. Voltage signals Siga$_1$ through Siga$_n$ are output from the LSI 11-4$_1$ and supplied to a signal processing part 61. In addition, voltage signals Sigb$_1$ through Sigb$_n$ are output from the LSI 11-4$_2$ and supplied to the signal processing part 61. The signal processing part 61 performs a signal processing (that is, an operation or computation) to obtain an average value, a maximum value, a minimum value, and the like of the voltage signals Siga$_1$ through Siga$_n$ and the voltage signals Sigb$_1$ through Sigb$_n$, and supplies a process result to a voltage control circuit 21. The voltage control circuit 21 controls the power supply voltage VDD that is output from the signal processing part 61 depending on the process result. The signal processing (that is, operation or computation) to be performed by the signal processing part 61 may be set appropriately depending on the usage or the like of the LSIs 11-4$_1$ and 11-4$_2$.

The present invention may be applied to various semiconductor integrated circuits in which there is a demand to control a power supply voltage constant within the semiconductor integrated circuit.

Although the embodiments are described as, for example, "one embodiment," or "another embodiment," the order in which the embodiments are described do not imply priorities of the embodiments. Many other variations and modifications will be apparent to those skilled in the art.

All examples and conditional language recited herein are intended for pedagogical purposes to aid the reader in understanding the invention and the concepts contribute by the inventor to furthering the art, and are to be construed as being without limitation to such specifically recited examples and conditions, nor does the organization of such examples in the specification related to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor integrated circuit comprising:
a first selector configured to selectively output one of a power supply voltage supplied from an outside of the semiconductor integrated circuit and a reference voltage to a monitoring target voltage terminal depending on an adjusting mode signal;
a voltage monitoring circuit configured to monitor a voltage fluctuation at the monitoring target voltage terminal and convert the monitored voltage fluctuation into a control signal;
an adjusting circuit configured to output the adjusting mode signal based on a clock signal and the control signal output from the voltage monitoring circuit; and
an output circuit configured to output the control signal to the outside of the semiconductor integrated circuit.

2. A semiconductor integrated circuit comprising:
a first selector configured to selectively output one of a power supply voltage supplied from an outside of the semiconductor integrated circuit and a reference voltage to a monitoring target voltage terminal depending on an adjusting mode signal;
a voltage monitoring circuit configured to monitor a voltage fluctuation at the monitoring target voltage terminal and convert the monitored voltage fluctuation into a control signal; and
an output circuit configured to output the control signal to the outside of the semiconductor integrated circuit,
wherein the voltage monitoring circuit comprises a plurality of inverter circuits each including a pair of transistors having mutually different threshold voltages at which outputs thereof change and applied with a voltage at the monitoring target voltage terminal as a power supply voltage, and
wherein an output pattern of the plurality of inverter circuits changes depending on a voltage level at the monitoring target voltage terminal.

3. The semiconductor integrated circuit as claimed in claim 2, wherein the first selector selectively outputs the reference voltage during a circuit adjusting period depending on the adjusting mode signal and selectively outputs the power supply voltage during a voltage monitoring period,
and further comprising:
an adjusting circuit configured to control a back bias signal supplied to the plurality of transistors based on the control signal output from the voltage monitoring circuit during the circuit adjusting period.

4. The semiconductor integrated circuit as claimed in claim 2, wherein the first selector selectively outputs the reference voltage during a circuit adjusting period depending on the adjusting mode signal and selectively outputs the power supply voltage during a voltage monitoring period,
and further comprising:
a second selector and a third selector configured to select the control signal that is to be selectively output depending on a control signal in accordance with a voltage monitoring sensitivity; and an adjusting circuit configured to control a back bias signal supplied to the plurality of transistors based on the control signal output from the voltage monitoring circuit during the circuit adjusting period, wherein the second selector selectively outputs the control signal from one of the plurality of inverter circuits formed by a transistor having a threshold voltage lower than that of another of the plurality of inverter circuits whose output is selectively output from the third selector.

5. A semiconductor integrated circuit comprising:
a first selector configured to selectively output one of a power supply voltage supplied from an outside of the semiconductor integrated circuit and a reference voltage to a monitoring target voltage terminal depending on an adjusting mode signal;
a voltage monitoring circuit configured to monitor a voltage fluctuation at the monitoring target voltage terminal and convert the monitored voltage fluctuation into a control signal; and
an output circuit configured to output the control signal to the outside of the semiconductor integrated circuit,
wherein the output circuit selectively outputs scan data during a test operation depending on a test mode signal, and selectively outputs the control signal during an operation.

6. The semiconductor integrated circuit as claimed in claim 4, further comprising:
a plurality of voltage monitoring circuits each of which is configured to monitor a voltage fluctuation at the monitoring target voltage terminal and converts the monitored voltage fluctuation into a control signal;
a first signal processing circuit configured to output the control signal by performing a signal processing on a first output signal that is selectively output from the second selector of each of the plurality of voltage monitoring circuits; and
a second signal processing circuit configured to output the control signal by performing a signal processing on a second output signal that is selectively output from the third selector of each of the plurality of voltage monitoring circuits.

7. A power supply voltage control method for controlling a power supply voltage supplied from a power supply control circuit to a semiconductor integrated circuit, the power supply voltage control method comprising:
switching a first selector within the semiconductor integrated circuit depending on an adjusting mode signal in order to selectively output a reference voltage to a monitoring target voltage terminal during a circuit adjusting period and the power supply voltage to the monitoring target voltage terminal during a voltage monitoring period;
converting a voltage fluctuation monitored by a voltage monitoring circuit within the semiconductor integrated circuit into a control signal by the voltage monitoring circuit;
outputting the adjusting mode signal from an adjusting circuit within the semiconductor integrated circuit based on a clock signal and the control signal output from the voltage monitoring circuit; and
controlling the power supply voltage output from the voltage control circuit by outputting the control signal from an output circuit within the semiconductor integrated circuit to the voltage control circuit.

8. A power supply voltage control method for controlling a power supply voltage supplied from a power supply control circuit to a semiconductor integrated circuit, the power supply voltage control method comprising:
switching a first selector within the semiconductor integrated circuit depending on an adjusting mode signal in order to selectively output a reference voltage to a monitoring target voltage terminal during a circuit adjusting period and the power supply voltage to the monitoring target voltage terminal during a voltage monitoring period;
converting a voltage fluctuation monitored into a control signal by a voltage monitoring circuit within the semiconductor integrated circuit; and
controlling the power supply voltage output from the voltage control circuit by outputting the control signal from an output circuit within the semiconductor integrated circuit to the voltage control circuit,
wherein the voltage monitoring circuit comprises a plurality of inverter circuits each including a pair of transistors having mutually different threshold voltages at which outputs thereof change and applied with a voltage at the monitoring target voltage terminal as a power supply voltage, and
wherein an output pattern of the plurality of inverter circuits changes depending on a voltage level at the monitoring target voltage terminal.

9. The power supply voltage control method as claimed in claim 8, further comprising:
controlling a back bias signal supplied to the plurality of transistors by an adjusting circuit based on the control signal output from the voltage monitoring circuit during the circuit adjusting period.

10. The power supply voltage control method as claimed in claim 8, further comprising:
switching a control signal that is selectively output from a second selector and a third selector depending on a control signal in accordance with a voltage monitoring sensitivity; and
controlling a back bias signal supplied to the plurality of transistors by an adjusting circuit based on the control signal output from the voltage monitoring circuit during the circuit adjusting period;
wherein the second selector selectively outputs the control signal from one of the plurality of inverter circuits formed by a transistor having a threshold voltage lower than that of another of the plurality of inverter circuits whose output is selectively output from the third selector.

11. The power supply voltage control method as claimed in claim 10, wherein the semiconductor integrated circuit further comprises at least one further voltage monitoring circuit that monitors a voltage fluctuation at the monitoring target voltage terminal and converts the monitored voltage fluctuation into an additional control signal,
and further comprising:
outputting the additional control signal by performing a signal processing on a first signal that is selectively output from the second selector of each of the plurality of voltage monitoring circuits by a first signal processing circuit; and
outputting the additional control signal by performing a signal processing on a second signal that is selectively output from the third selector of each of the plurality of voltage monitoring circuits by a second signal processing circuit.

12. A power supply voltage control method for controlling a power supply voltage supplied from a power supply control circuit to a semiconductor integrated circuit, the power supply voltage control method comprising:

switching a first selector within the semiconductor integrated circuit depending on an adjusting mode signal in order to selectively output a reference voltage to a monitoring target voltage terminal during a circuit adjusting period and the power supply voltage to the monitoring target voltage terminal during a voltage monitoring period;

converting a voltage fluctuation monitored into a control signal by a voltage monitoring circuit within the semiconductor integrated circuit;

controlling the power supply voltage output from the voltage control circuit by outputting the control signal from an output circuit within the semiconductor integrated circuit to the voltage control circuit; and controlling the output circuit depending on a test mode signal in order to selectively output scan data during a test operation and selectively output the control signal during an operation.

* * * * *